United States Patent [19]

Kwon et al.

[11] Patent Number: 6,084,259

[45] Date of Patent: Jul. 4, 2000

[54] PHOTODIODE HAVING CHARGE TRANSFER FUNCTION AND IMAGE SENSOR USING THE SAME

[75] Inventors: Oh Bong Kwon; Ki Nam Park; Do Young Lee; Jae Won Eom, all of Ichon-chi, Rep. of Korea

[73] Assignee: Hyundai Electronics Industries Co., Ltd., Ichon-Shi, Rep. of Korea

[21] Appl. No.: 09/343,099

[22] Filed: Jun. 29, 1999

[30] Foreign Application Priority Data

Jun. 29, 1998 [KR] Rep. of Korea .................. 98-24655
Jul. 30, 1998 [KR] Rep. of Korea .................. 98-30962

[51] Int. Cl.[7] .................... H01L 31/062; H01L 31/113
[52] U.S. Cl. .................... 257/292; 257/290; 257/291; 257/463
[58] Field of Search .................... 257/290, 291, 257/292, 443, 461, 463

[56] References Cited

U.S. PATENT DOCUMENTS

| | | | |
|---|---|---|---|
| 4,984,047 | 1/1991 | Stevens | 357/30 |
| 5,051,797 | 9/1991 | Erhardt | 357/24 |
| 5,721,415 | 2/1998 | Fortmann et al. | 219/109 |
| 5,841,159 | 11/1998 | Lee et al. | 257/291 |
| 5,880,495 | 3/1999 | Chen | 257/233 |
| 5,977,576 | 11/1999 | Hamasaki | 257/292 |
| 6,023,081 | 2/2000 | Drowley et al. | 257/292 |

Primary Examiner—Ngân V. Ngô
Attorney, Agent, or Firm—Townsend and Townsend and Crew LLP

[57] ABSTRACT

The present invention relates to an image sensor; and, more particularly, to a CMOS image sensor employing photodiodes which linearly increase the ability of keeping up photogenerated charges. In accordance with the present invention, a unit pixel of a CMOS image sensor comprises: a photodiode including: a) an N-type semiconductor region and a P-type semiconductor region for a PN junction to which a reverse bias is applied; and b) a highly doped region formed on one of the N-type semiconductor region and the P-type semiconductor region for collecting carriers of electron-hole pairs generated in a depletion region of the PN junction so that a voltage drop of the reverse bias is linear; and an image data processing unit for producing an image data in response to the carriers transferred from the highly doped region.

15 Claims, 6 Drawing Sheets

PHOTODIODE HAVING CHARGE TRANSFER FUNCTION AND IMAGE SENSOR USING THE SAME

FIELD OF THE INVENTION

The present invention relates to an image sensor; and, more particularly, to a CMOS image sensor employing photodiodes which linearly increase the ability of keeping up photogenerated charges.

DESCRIPTION OF THE PRIOR ART

Generally, CCD (charge coupled device) has been widely used to process electronic image data. Although CCD technology provides an excellent data processing efficiency for electronic images, recent trends towards lower power consumption and greater system integration have spurred efforts to utilize existing submicron CMOS technology for electronic imaging applications. Such a CCD image sensor, which is different from CMOS image sensors to detect image signals through a switching operation of a transistor, detects the image signals using a charge coupling. Photodiodes in the CCD image sensor don't immediately extract photoelectric current, but extract it after the charges are accumulated into a signal packet for a predetermined time. Accordingly, since the conventional CCD image sensor has a sufficient integration time, high sensitivity and low noise image can be achieved.

However, since the conventional CCD image sensor should transfer the photogenerated charges continuously, the driving method is very complicated and high voltage of approximately 8V to 10V and high power of 1 W or more are needed. Also, compared with the submicron CMOS process to need about 20 mask processes, the conventional CCD image sensor to need about 30–40 mask processes may be relatively more complicated and also more expensive. Furthermore, since the signal processing circuit implemented by the CMOS process can not be manufactured in an area in which the conventional CCD image sensor is formed, the sensing and signal processing elements can not be made on one-chip, thereby depreciating the variety of its function.

APS (Active Pixel Sensor) detecting the image signals through a transistor switching, which is fabricated by combining the CMOS and CCD processes, has been disclosed in U.S. Pat. No. 5,625,210 entitled "Active pixel sensor integrated with a pinned photodiode" by Lee. et al.

Figure 1:
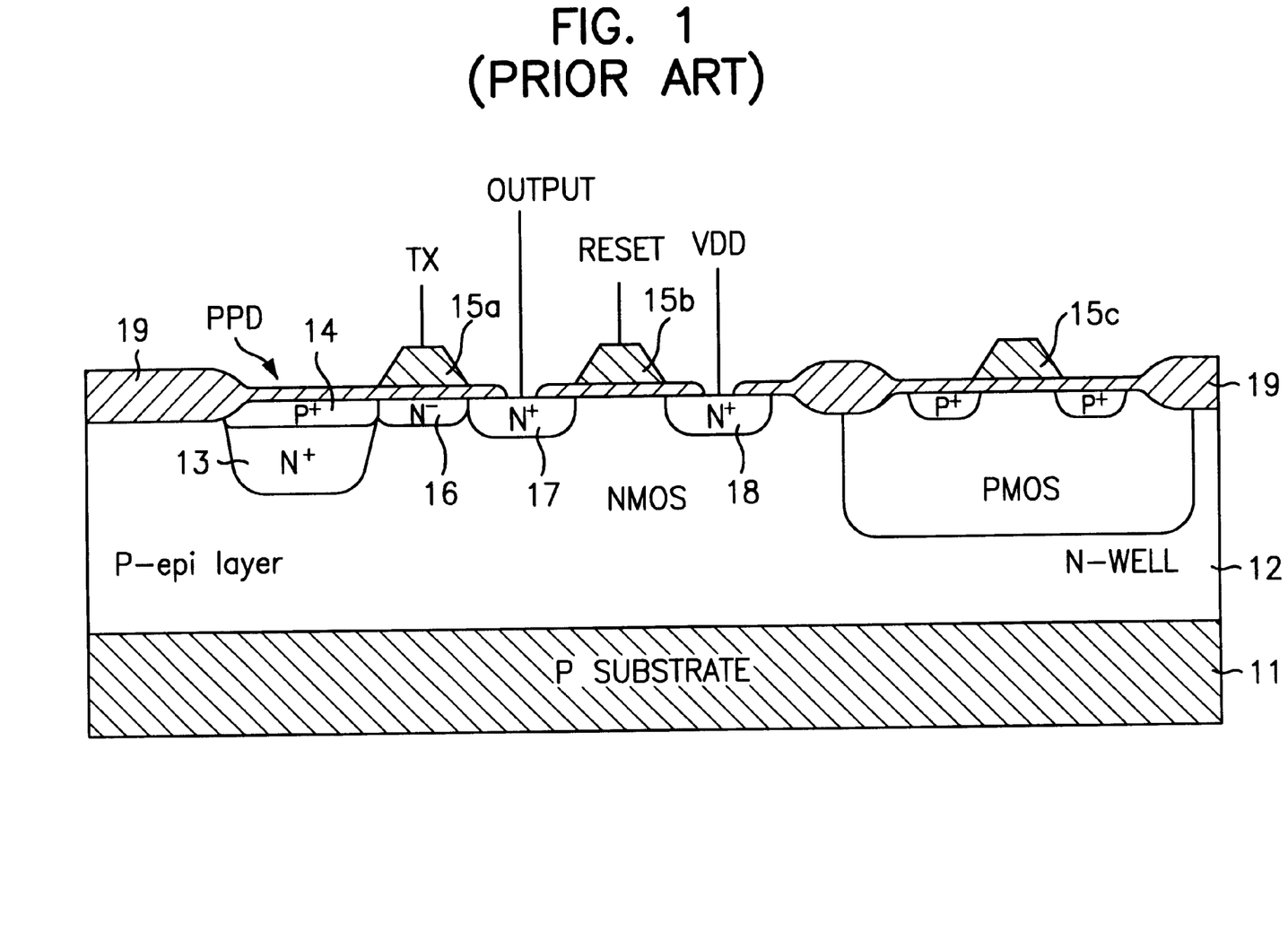
FIG. 1 is a cross-sectional view illustrating a conventional APS.

Referring to FIG. 1, the APS is integrated with a pinned photodiode for sensing light from an object. To transfer the photogenerated charges generated in the pinned photodiode to an output node, i.e., a floating N+ region 17, a transfer 15a is formed between the pinned photodiode and the floating N+ region 17. A channel of the transfer transistor 15a is formed in a lightly doped N− region 16. Also, there is provided a reset transistor 15b having a highly doped N+ region 18 connected to a power supply VDD and the floating N+ region 17 as source/drain regions. The reset transistor 15b resets the floating N+ region 17 in response to a reset signal from a controller. The pinned photodiode is formed in a P-epi (epitaxial) layer 12 formed on a P substrate 11, consisting of a highly doped P+ region 14 and a highly doped N+ region 13. Additionally, in FIG. 1, the reference numerals 19 and 15c denote a field oxide layer and a select transistor, respectively.

In the unit pixel of the image sensor of FIG. 1, when the transfer transistor 15a and the reset transistor 15b are turned on, a reverse bias is applied between the highly doped N+ region 13 and the P-type layer (the P-epi layer 12 and the highly doped P+ region 14) and then the highly doped N+ region 13 is fully depleted. When the highly doped N+ region 13 is fully depleted, the voltage across the highly doped N+ region 13 is fixed to a specific voltage and it is called "pinning voltage." Since the pinned photodiode has a wide depletion region, it has a merit in that much photogenerated charges can be produced and accumulated.

Figure 2A:
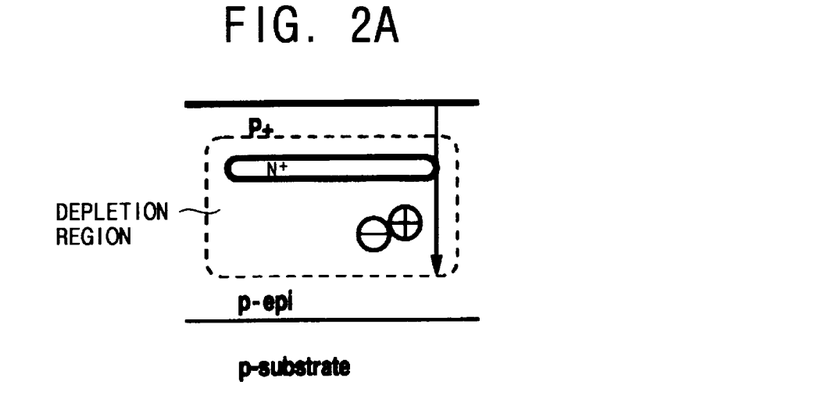
FIGS. 2a to 2C are cross-sectional views illustrating a conventional pinned photodiode.

As shown in FIG. 2a, when the depletion region of the highly doped N+ region 13 is extended, such a depletion mainly occurs downward because the concentration of the P-epi layer 12 is lower than that of the highly doped P+ region 14. Accordingly, this wide depletion region is contributed to the creation of many electron-hole pairs so that photoelectric capture of almost 100% may be obtained. These captured charges are transferred to the floating N+ region 17 through the transfer transistor 15a with a good sensitivity.

Figure 2B:
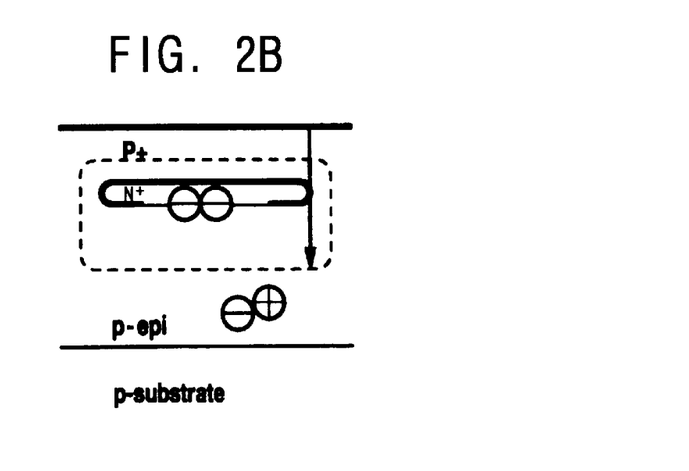
Figure 2C:
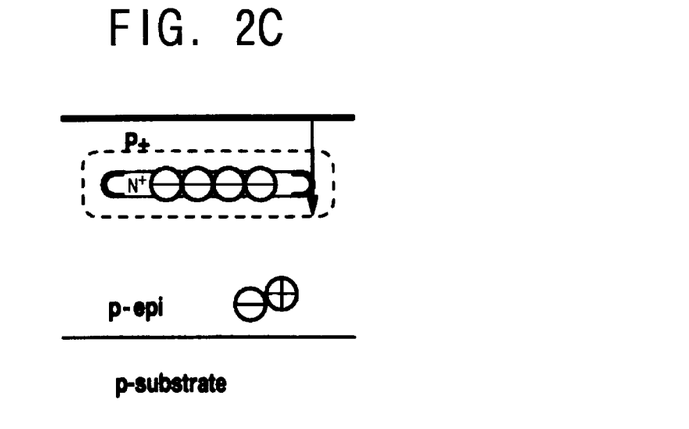

However, as shown in FIGS. 2b and 2c, the more the highly doped N+ region of the PN junction captures the photogenerated charges, the more the depletion region is decreased due to the reduction of the reverse bias across the PN junction. That is, the ability of capturing the photogenerated charges becomes worse. Also, since the area of the P-epi layer which gets out of depletion region becomes wider and then thermally generated charges increase at the deep P-epi layer, dark current becomes larger.

Furthermore, since the reverse bias across the PN junction decreases with the capture of photogenerated charges in the highly doped N+ region of the PN junction, the attraction of the highly doped N+ region to the photogenerated charges becomes weak, so that data from the captured charges is non-linear and is saturated, specifically in bright light. As a result, the sensitivity and resolution of the image sensor deteriorates in bright light.

SUMMARY OF THE INVENTION

It is, therefore, an object of the present invention to provide a photodiode capable of capturing photogenerated charges linearly at the initial state.

It is another object of the present invention to provide a CMOS image sensor with good sensitivity and resolution.

It is further another object of the present invention to provide an improved method for obtaining image output data in the CDS (Correlated Double Sampling).

In accordance with an aspect of the present invention, there is provided a unit pixel in an image sensor, the unit pixel comprising: a photodiode including: a) an N-type semiconductor region and a P-type semiconductor region for a PN junction to which a reverse bias is applied; and b) a highly doped region formed on one of the N-type semiconductor region and the P-type semiconductor region for collecting carriers of electron-hole pairs generated in a depletion region of the PN junction so that a voltage drop of the reverse bias is linear; and an image data processing means for producing an image data in response to the carriers transferred from the highly doped region.

In accordance with another aspect of the present invention, there is provided a photodiode comprising: a semiconductor layer of a first conductive type, where a first voltage level is allied to the semiconductor layer; a first diffusion region of a second conductive type, wherein the first diffusion region is formed beneath a surface of the semiconductor layer and wherein a second voltage level is applied to the first diffusion region through a switching means; and a second diffusion region formed beneath the first diffusion region and within the semiconductor layer, wherein the second diffusion region is fully depleted between the first and second voltage levels, whereby the second diffusion region transfers carriers of electron-hole pairs to the first diffusion region.

In accordance with further another aspect of the present invention, there is provided a unit pixel in an image sensor, the unit pixel comprising: a semiconductor layer of a first conductive type, wherein a first voltage level is allied to the semiconductor layer; a first diffusion region of a second conductive type, wherein the first diffusion region is formed within the semiconductor layer and wherein the first diffusion region is fully depleted when a second voltage level is applied thereto; a second diffusion region of the second conductive type, wherein the second diffusion region is formed beneath a surface of the semiconductor layer and on a portion of the first diffusion region; a third diffusion region formed on the first diffusion region, surrounding the second diffusion region; and a transistor operating a switching means for evaluating a data sensing period and a reset level sensing period, wherein the second voltage level is applied to the second diffusion region between the data sensing period and the reset level sensing period, the transistor including: a) a gate electrode formed on the semiconductor layer, being apart from the second diffusion region; and b) a drain region electrically coupled to a power supply to provide the second voltage level, wherein the first diffusion region acts as a source region, whereby the second diffusion region receives carriers of electron-hole pairs from the first diffusion region so that the second diffusion region directly transfers the received carriers to an image data processing means.

BRIEF DESCRIPTION OF THE DRAWINGS

The above and other objects and features of the present invention will become apparent from the following description of the preferred embodiments given in connection with the accompanying drawings, in which.

DETAILED DESCRIPTION OF THE PREFERRED EMBODIMENTS

Hereinafter, the present invention will be described in detail referring to the accompanying drawings.

Figure 3:
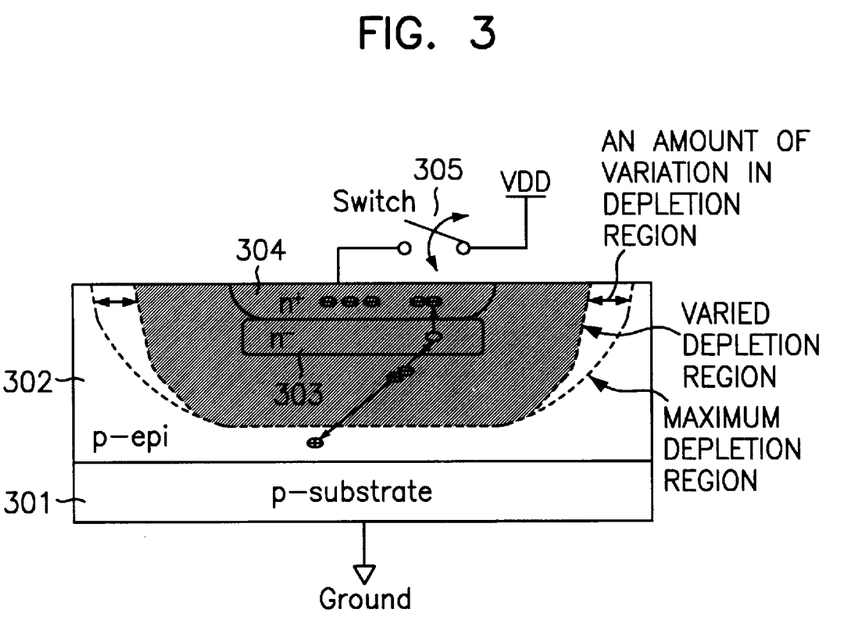
FIG. 3 is a cross-sectional view illustrating a photodiode in accordance with an embodiment of the present invention.

Referring to FIG. 3, a photodiode in accordance with the present invention includes a P-epi layer 302 formed on a P substrate 301 to which a ground voltage level is applied, a highly doped N+ region 304 which is formed beneath the surface of the p-epi layer 302 and receives supply power VDD through a switch 305, and a lightly doped N− region 303 which is formed beneath the highly doped N+ region 304. The lightly doped N− region 303 is fully depleted between a ground voltage and a power supply voltage VDD.

When a switch 305 is turned on, the lightly doped N− region 303 is fully depleted. At this time, the concentration of the lightly doped N− region 303 should be controlled in order that a voltage across the lightly doped N− region 303, i.e., pinning voltage ($V_{pinning}$), is about VDD/2. When the switch, which was turned on, is turned off, the potential of the highly doped N+ region 304, the lightly doped N− region 303 and the p-epi layer 302 may be VDD, $V_{pinning}$ and $V_{ground}$, respectively (where, VDD>$V_{pinning}$>$V_{ground}$).

Electrons of the electron-hole pairs which are generated in the depletion region by incident light are captured in the highly doped N+ region 304 via the lightly doped N− region 303 (while holes are transferred to the P-epi layer). In the photodiode of the conventional APS, since the highly doped N+ region 13 in FIG. 1, which is fully depleted region, captures the electrons, the more the highly doped N+ region 13 captures the electrons, the more depth (or size) of the depletion is shallow with the reduction of the reverse bias. However, in the present invention, the lightly doped N− region 303, which is fully depleted, doesn't capture and hold the charges continuously. That is, since the lightly doped N− region 303 transfers the captured charges to the highly doped N+ region 304, the potential VDD goes down so that the depletion region is diminished in a lateral direction. However, there may be no variation of the depth of the lightly doped N− region 303.

Figure 4:
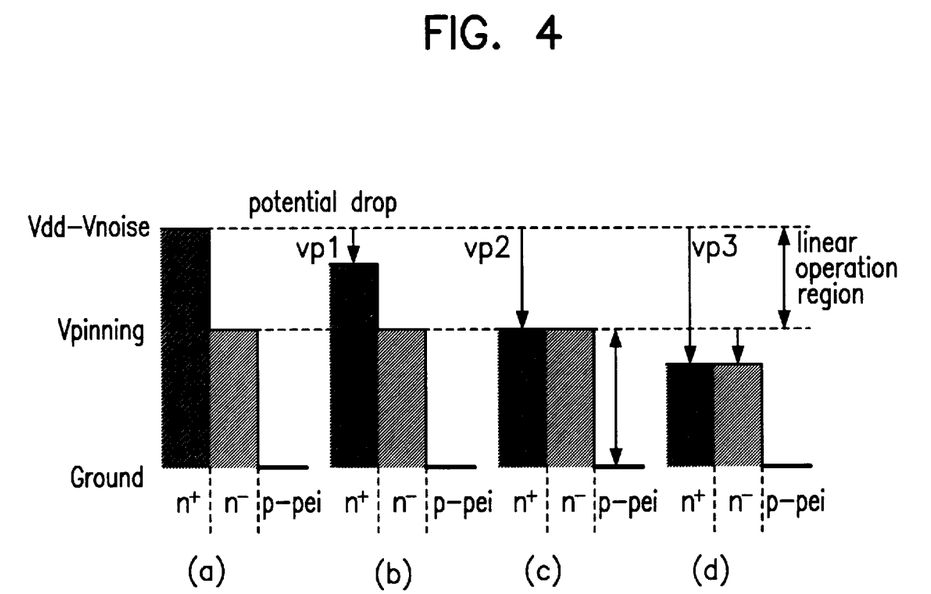
FIG. 4 is a graph illustrating potential generated in each layer of the photodiode of FIG. 3.

FIG. 4 is a graph illustrating a variation of the photodiode of FIG. 3. Referring to FIG. 4, if the switch 305 is turned on and, thereafter, it is turned off (section (a)), the voltages applied to the highly doped N+ region 304, the lightly doped N− region 303 and the P-epi layer 302 are VDD-$V_{noise}$, $V_{pinning}$ and $V_{ground}$, respectively, at the initial state. The reason why the highly doped N+ region 304 has a voltage of VDD-$V_{noise}$, instead of VDD, is that the coupling noise from the switch and the charge injection noise may be generated. At section (b) in which light sensing is in process, the voltage drop of Vp1 is made in the highly doped N+ region 304 while the electrons are captured therein. At section (c) in which the light sensing operation is completed somewhat, the voltage in the highly doped N+ region 304 drops by Vp2 so that the voltage across the highly doped N+ region 304 is the same as the pinning voltage $V_{pinning}$ across the lightly doped N− region 303. If the voltage of the highly doped N+ region 304 continuously drops as shown in section (d), the pinning is dissolved and the voltage across the lightly doped N− region 303 drops according to an amount of the voltage drop in the highly doped N+ region 304.

As state above, the photodiode in accordance with the present invention can accumulate a lot of photogenerated charges because the potential of the highly doped N+ region 304 linearly drops up to the pinning voltage $V_{pinning}$. Furthermore, since the depth of the depletion region is not decreased, most electrons are transferred to the highly doped N+ region 304. This photodiode set fourth above is called "on-transfer pinned photodiode." It should be noted that the on-transfer pinned photodiode acts as a photodiode together with a transfer.

On the other hand, in the conventional pinned photodiode, since the initial voltage drop starts from the pinning voltage, a non-linear voltage drop occurs.

Figure 5:
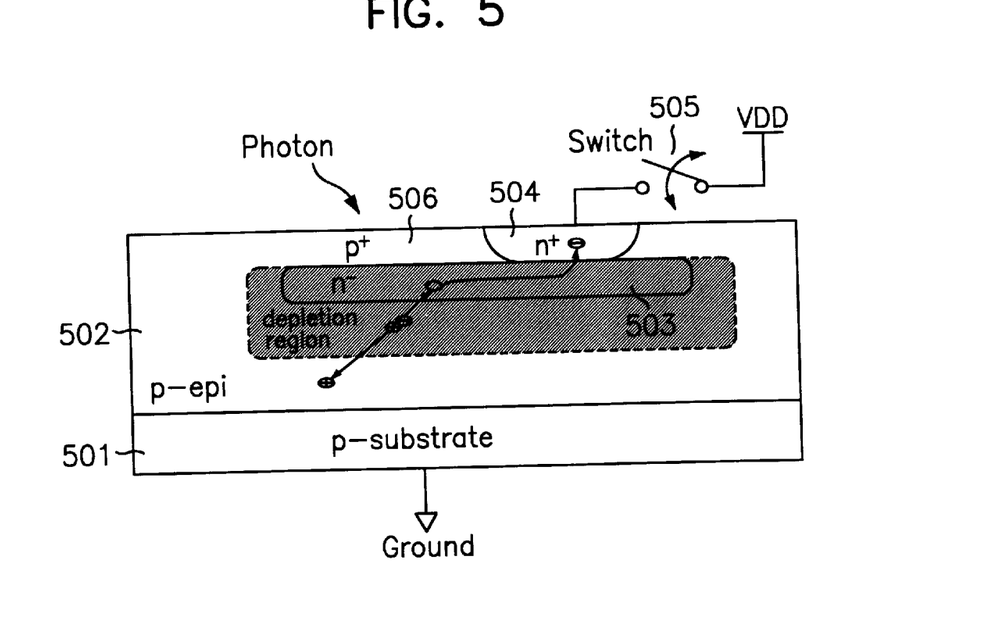
FIG. 5 is a cross-sectional view illustrating a photodiode in accordance with another embodiment of the present invention.

It may be possible to apply the above "on-transfer pinned photodiode to a CMOS image sensor requiring a photodiode and a transfer transistor. To apply the "on-transfer pinned photodiode to the CMOS image sensor, as shown in FIG. 5, the photodiode in accordance with the present invention includes an additional highly doped N+ region 504. That is, the on-transfer pinned photodiode in a CMOS image sensor of the present invention includes a P-epi layer 502, a highly doped N+ region 504, a lightly doped N− region 503, and a highly doped P+ region 506.

The P-epi layer 502, which is formed on a P substrate 501 to which a ground voltage level is applied, contains the highly doped N+ region 504, the lightly doped N− region 503 and the highly doped P+ region 506. The highly doped P+ region 506 and the highly doped N+ region 504 are formed beneath the surface of the p-epi layer 502. As compared with the highly doped P+ region 506, the highly doped N+ region 504 occupies small area. In addition, the highly doped N+ region 504 is surrounded by the highly doped P+ region 506 and the highly doped P+ region 506 is in contact with the p-epi layer 502. Accordingly, the p-epi layer 502 has the same potential as the highly doped P+ region 506. Such a contact between the p-epi layer 502 and the highly doped P+ region 506 is achieved by two ion implantation masks which differ from each other in pattern size. The lightly doped N− region 503 for providing a full depletion region is formed beneath the highly doped P+ region 506 and the highly doped N+ region 504. The power supply VDD is applied to the highly doped N+ region 504 through a switch 505.

The on-transfer pinned photodiode in FIG. 5 has the highly doped P+ region 506 on the lightly doped N− region 503, being different from that in FIG. 4. Accordingly, the on-transfer pinned photodiode in FIG. 5 has all features of the pinned photodiode and the linear voltage drop feature illustrated in FIG. 4. As a result, the on-transfer pinned photodiode in FIG. 5 can collect the photogenerated charges much more for a short time with the linear operation of the power voltage drop.

While the voltage sensing range of the conventional pinned photodiode is from the pinning voltage to the ground voltage, the highly doped N+ region 504 of the on-transfer pinned photodiode (hereafter, referred to as an OT-PPD) in accordance with the present invention has a voltage range of the power supply voltage VDD (much more than the pinning voltage) to the ground voltage. High resolution and sensitivity of the image sensor may be improved by employing the above-mentioned OT-PPD. In particular, in the case where the OT-PPD is applied to the CMOS image sensor, such a CMOS image sensor may have merits of the typical CMOS image sensor with improved resolution and sensitivity. Furthermore, the CMOS image sensor having the OT-PPD in accordance with the preset invention may make the dynamic range (voltage variation range in the output of the unit pixel) maximum.

Figure 6:
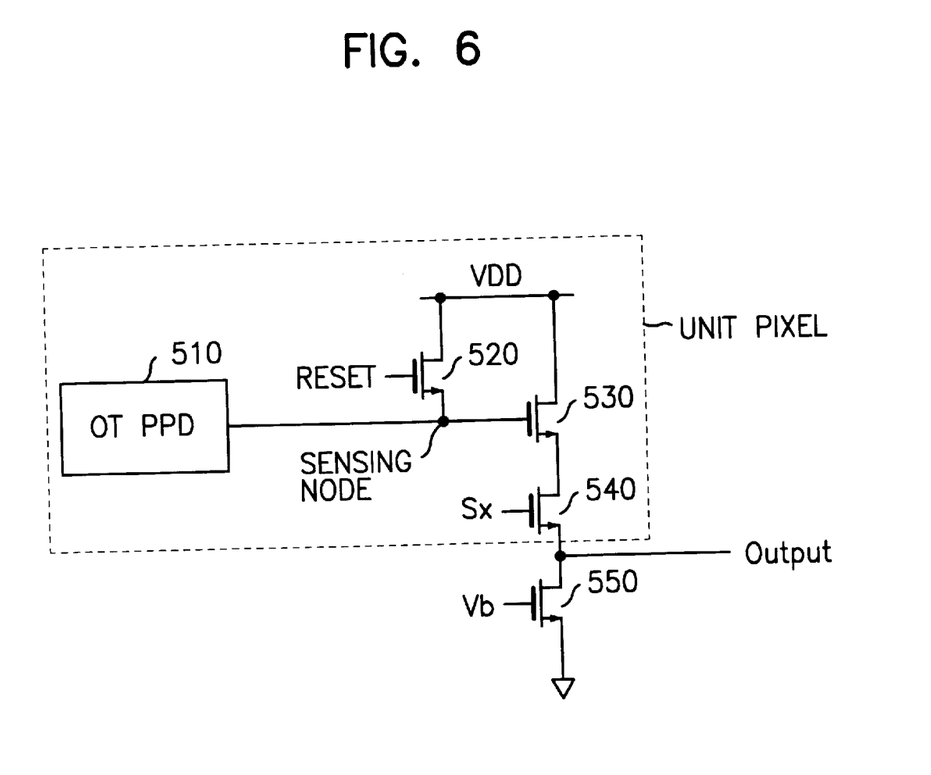
FIG. 6 is a circuit diagram illustrating a unit pixel of CMOS image sensor in accordance with the present invention.

FIG. 6 is a circuit diagram view illustrating the CMOS image sensor having the OT-PPD in accordance with the present invention. As shown in FIG. 6, a unit pixel of the CMOS image sensor includes one OT-PPD 510 and three NMOS transistors (it should be note that a transfer transistor is not shown in FIG. 6). A first transistor is a reset transistor 520 for resting the photogenerated charges generated in the OT-PPD, a second transistor is a drive transistor 530 acting as a source follower, and a third transistor is a select transistor 540 for receiving address signals. The reference numeral 550 denotes a load transistor.

The reset transistor 520 is made up of a native gate so that the charge transfer efficiency is improved. Such a negative threshold voltage can prevent electron losses from being generated by a voltage drop of a positive threshold voltage and then contribute the charge transfer efficiency to be improved.

As stated above, since the unit pixel of the image sensor in accordance with the present invention doesn't use a transfer transistor, it is possible to make a highly integrated circuit by minimizing the size of the unit pixel. Further, the usage of the OT-PPD in the CMOS image sensor has an additional merit in that it is possible to exclude the change of unit pixel's operation, which is caused by the transfer transistor fabricating processes.

Figure 7:
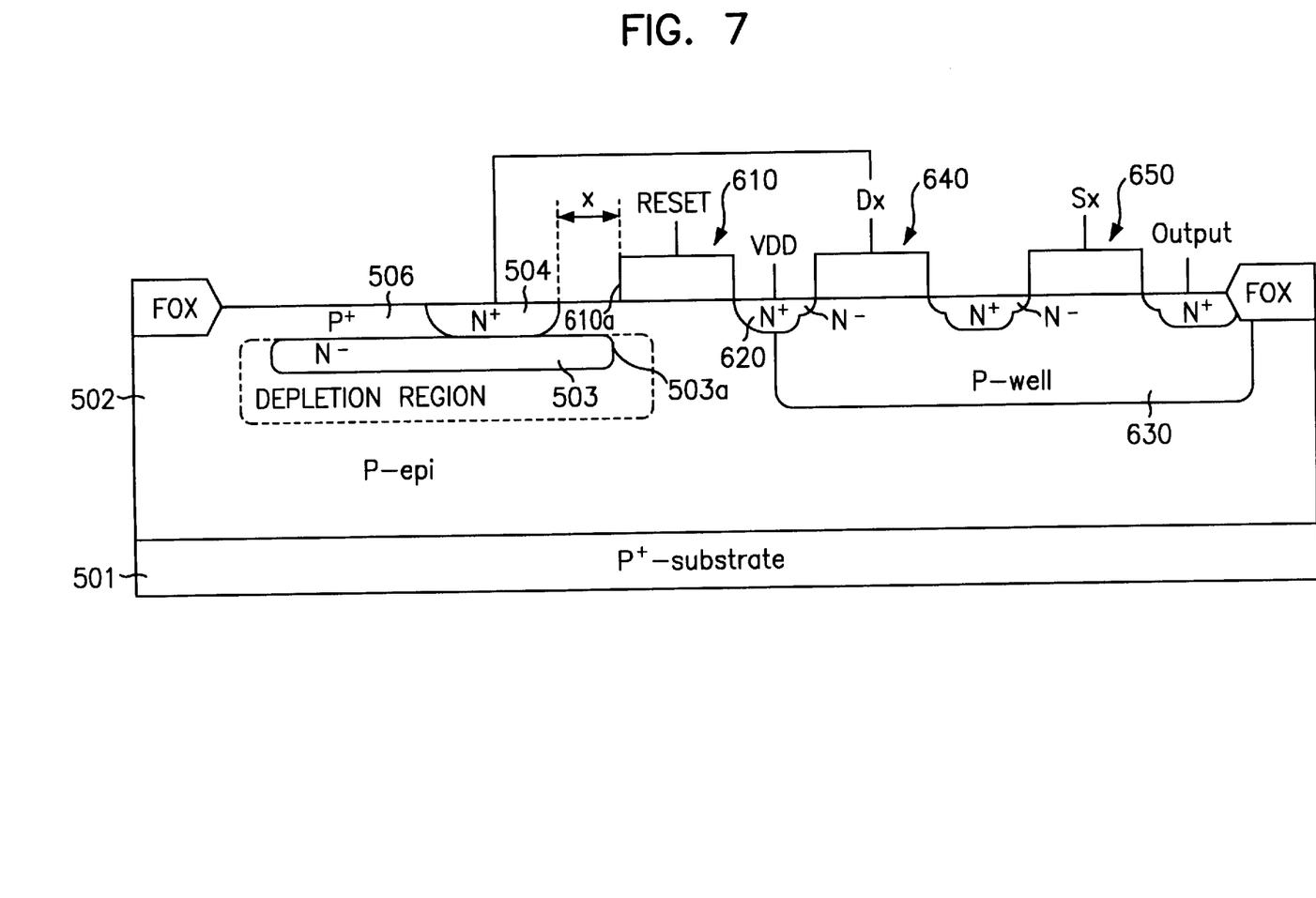
FIG. 7 is a cross-sectional view illustrating the unit pixel having the photodiode of FIG. 5.

FIG. 7 is a cross-sectional view illustrating the CMOS image sensor having the OT-PPD in accordance with the present invention. The parts shown in the OT-PPD of FIG. 7 which are the same as those in FIG. 5 have the same reference numerals.

Referring to FIG. 7, a P-epi layer 502 is formed on a P+ substrate 501 to which the ground voltage is applied and the impurity concentration of the P+ substrate 501 is higher than that of the P-epi layer 502. By using such a P-epi layer 502, the "Cross Talk" between the unit pixels, which is caused by the random drift of the photogenerated charges generated in deep place of the substrate, is prevented. A gate of a reset transistor 610 receiving a rest signal is formed on the P-epi layer 502 and an edge 610a of the reset transistor 610 is aligned with an edge 503a of a lightly doped N− region 503 in a vertical straight line. Further, the edge 610a is apart from the edge of a highly doped N+ region 504 by a distance of X. An N+ drain diffusion region 620 of the reset transistor 610, which is formed in the P-epi layer 502, is electrically connected to a power supply voltage VDD. When the reset transistor 610 is turned on, the lightly doped N− region 503 is fully depleted between the power supply voltage VDD and the ground voltage. The electrons captured in the fully depleted region are immediately transferred to the highly doped N+ region 504.

On the other hand, a P-well region 630 is formed in the P-epi layer 502 in which a drive transistor 640 and a select transistor 650 are formed and also the drive and select transistors 640 and 650 have a LDD (Lightly Doped Drain) structure. Impurity ions are implanted into the channel regions of the drive and select transistors 640 and 650 in order to adjust their threshold voltage. Accordingly, while the drive transistor 640 and the select transistor 650, which are made up of the typical NMOS transistor, have a positive threshold voltage, the reset transistor 610 has a negative threshold voltage which doesn't require any ion-implantation to adjust the threshold voltage of the channel region. The gate of the drive transistor 640 is electrically connected to the highly doped N+ region 504 and an N+ drain diffusion region 620 is common to the drive transistor 640 and the reset transistor 610. The select transistor 650 having a diffusion region, which is common to the driver transistor 640, has another diffusion region as an output node.

If the reset transistor 610 is turned on, the voltage applied to the lightly doped N− region 503 becomes larger and the lightly doped N− region 503 is depleted. Then, when the lightly doped N− region 503 is fully depleted, the voltage applied to the lightly doped N− region 503 is fixed to the pinning voltage $V_{pinning}$. At this time, the voltage across the highly doped N+ region 504 is increased up to VDD because the reset transistor 610 has been turned on yet. The charges positioned within the lightly doped N− region 503 flow into the N+ drain diffusion region 620.

Next, the OT-PPD starts the light sensing operation while the reset transistor 610 is turned off. Meanwhile, when the reset transistor 610 is turned off, the highly doped N+ region 504 doesn't maintain the voltage of VDD due to the clock feed-through and capacitive coupling, but has the voltage of VDD-$V_{noise}$. In the present invention, to reduce such a noise, there is provided a predetermined distance X between the gate of the reset transistor 610 and the highly doped N+ region 504. As illustrated in FIG. 4, the linear charge collection ability of the OT-PPD may considerably increase, by increasing the time necessary to drop the voltage applied to the highly doped N+ region 504 from VDD-$V_{noise}$ to $V_{pinning}$. Furthermore, since the preset invention may make the dynamic range maximum, higher resolution may be obtained.

The conventional unit pixel using the transfer transistor read out a reset level after turning off the transfer transistor and turning on the reset transistor and, thereafter, the voltage level of the sensing node is read out after turning on the transfer transistor and turning off the reset transistor. By obtaining the voltage difference between these two levels, actual data caused by the photogenerated charges are obtained. However, in the present invention, the voltage level of the sensing node is first read out and, thereafter, the reset level is read out.

Figure 8:
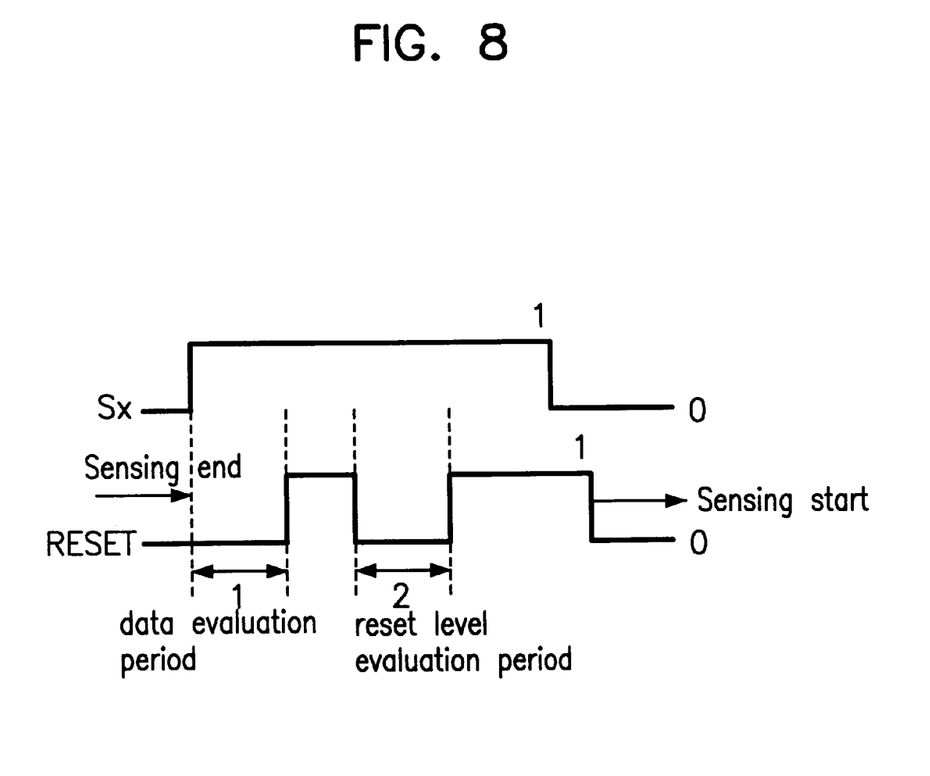
FIG. 8 is a timing chart illustrating control signals in the CDS method in accordance with the present invention.

FIG. 8 is a timing chart illustrating control signals in the CDS method in accordance with the present invention. As shown in FIG. 8, the OT-PPD senses light form an object (reset signal RESET to control the reset transistor is in a low level). When a select signal Sx is activated in a high level, a corresponding pixel is selected and then the sensing result in the OT-PPD by that time is output to the output terminal (in FIG. 6) of the unit pixel. Therefore, the data in the sensing node is obtained before the reset transistor is turned on ("1" in FIG. 8).

Next, to read out various noises generated in unit pixel array itself, the reset transistor is turned on ("2" in FIG. 8) and then noise level is obtained. Thereafter, if the select signal Sx is disabled when the reset signal is activated, the light sensing operation starts again.

As apparent from the above, since the full depletion layer in the OT-PPD transfers the captured charges to the highly doped N+ region immediately, the image sensor according to the present invention carries out fast and exact sensing operations. Furthermore, since the image sensor according to the present invention directly reads out the captured charges from the photodiode, the SNR (signal to noise ratio) is improved. Furthermore, since the present invention doesn't use a transistor in transferring the charges generated in the pinned photodiode, errors caused by the charge injection between the drain and the source may be prevented.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:
1. A photodiode comprising:
   a semiconductor layer of a first conductive type, wherein a first voltage level is allied to the semiconductor layer;
   a first diffusion region of a second conductive type, wherein the first diffusion region is formed beneath a surface of the semiconductor layer and wherein a second voltage level is applied to the first diffusion region through a switching means; and
   a second diffusion region formed beneath the first diffusion region and within the semiconductor layer, wherein the second diffusion region is fully depleted between the first and second voltage levels,
   whereby the second diffusion region transfers carriers of electron-hole pairs to the first diffusion region.
2. The photodiode in accordance with claim 1, wherein the second diffusion region is wider than the first diffusion region and wherein the photodiode further comprises a third diffusion region of the first conductive type which is formed beneath the semiconductor layer and on the second diffusion region.
3. The photodiode in accordance with claim 1, wherein an impurity concentration of the first diffusion region is higher than that of the second diffusion region.
4. The photodiode in accordance with claim 1, wherein the semiconductor layer is an epitaxial layer grown on a semiconductor substrate, wherein the semiconductor layer and the semiconductor substrate have the same conductive type, and wherein an impurity concentration of the semiconductor substrate layer is higher than that of the epitaxial layer.
5. The photodiode in accordance with claim 1, wherein the first diffusion region receives the carries of the electron-hole pairs from the second diffusion region when the second voltage level is not supplied.
6. The photodiode in accordance with claim 2, wherein an area of the third diffusion layer is larger than that of the first diffusion layer and wherein an impurity concentration of the third diffusion region is higher than that of the semiconductor layer.
7. A unit pixel in an image sensor, the unit pixel comprising:
   a semiconductor layer of a first conductive type, wherein a first voltage level is allied to the semiconductor layer;
   a first diffusion region of a second conductive type, wherein the first diffusion region is formed within the semiconductor layer and wherein the first diffusion region is fully depleted when a second voltage level is applied thereto;
   a second diffusion region of the second conductive type, wherein the second diffusion region is formed beneath a surface of the semiconductor layer and on a portion of the first diffusion region;
   a third diffusion region formed on the first diffusion region, surrounding the second diffusion region; and
   a transistor operating as a switching means for evaluating a data sensing period and a reset level sensing period, wherein the second voltage level is applied to the second diffusion region between the data sensing period and the reset level sensing period, the transistor including:
      a) a gate electrode formed on the semiconductor layer, being apart from the second diffusion region; and
      b) a drain region electrically coupled to a power supply to provide the second voltage level, wherein the first diffusion region acts as a source region,
   whereby the second diffusion region receives carriers of electron-hole pairs from the first diffusion region so that the second diffusion region directly transfers the received carriers to an image data processing means.
8. The photodiode in accordance with claim 7, wherein the semiconductor layer is in contact with the third diffusion region so that the semiconductor layer and the third diffusion region have the same potential when the second voltage level is applied the second diffusion region.

9. The unit pixel in accordance with claim 7, wherein the unit pixel further comprises a well region of the first conductive region, being formed within the semiconductor layer and wherein the image data processing means is formed on the well region, being electrically coupled to the second diffusion region.

10. The unit pixel in accordance with claim 9, wherein the image data processing means comprises:
   a driver transistor for driving the power supply in response to an output from the second diffusion region; and
   a select transistor for receiving address signals for outputting an image data sensed in the unit pixel.

11. The unit pixel in accordance with claim 7, wherein the first diffusion region is fully depleted between the first and second voltage levels.

12. The unit pixel in accordance with claim 7, wherein an impurity concentration of the first diffusion region is lower than that of the second diffusion region.

13. The unit pixel in accordance with claim 7, wherein the semiconductor layer is an epitaxial layer formed on a semiconductor substrate of the first conductive type.

14. A unit pixel in an image sensor, the unit pixel comprising:
   a photodiode including:
      a) an N-type semiconductor region and a P-type semiconductor region for a PN junction to which a reverse bias is applied; and
      b) a highly doped region formed on one of the N-type semiconductor region and the P-type semiconductor region for collecting carriers of electron-hole pairs generated in a depletion region of the PN junction so that a voltage drop of the reverse bias is linear; and
   an image data processing means for producing an image data in response to the carriers transferred from the highly doped region.

15. The unit pixel in accordance with claim 14, wherein the image data processing unit comprises:
   a reset transistor operating as a switching means for evaluating a data sensing period and a reset level sensing period of the photodiode
   a driver transistor for driving a power supply in response to an output from the photodiode; and
   a select transistor for receiving address signals for outputting an image data sensed in the unit pixel.

* * * * *

UNITED STATES PATENT AND TRADEMARK OFFICE
CERTIFICATE OF CORRECTION

PATENT NO. : 6,084,259 Page 1 of 1
APPLICATION NO. : 09/343099
DATED : July 4, 2000
INVENTOR(S) : Oh Bong Kwon et al.

It is certified that error appears in the above-identified patent and that said Letters Patent is hereby corrected as shown below:

On the cover page of U.S. Patent No. 6,084,259 under inventors, please change "Jae Won Eom" to --Jae Won Bom--.

Signed and Sealed this

Twenty-first Day of July, 2009

JOHN DOLL
*Acting Director of the United States Patent and Trademark Office*